US005514888A

United States Patent [19]
Sano et al.

[11] Patent Number: 5,514,888
[45] Date of Patent: May 7, 1996

[54] ON-CHIP SCREEN TYPE SOLID STATE IMAGE SENSOR AND MANUFACTURING METHOD THEREOF

[75] Inventors: Yoshikazu Sano; Hiroshi Okamoto, both of Osaka, Japan

[73] Assignee: Matsushita Electronics Corp., Osaka, Japan

[21] Appl. No.: 67,507

[22] Filed: May 24, 1993

[30] Foreign Application Priority Data

May 22, 1992 [JP] Japan .................................. 4-130458

[51] Int. Cl.⁶ ........................ H01L 27/148; H01L 29/768
[52] U.S. Cl. ........................ 257/232; 257/233; 257/432; 257/435; 437/53
[58] Field of Search ................................. 257/231, 232, 257/233, 435, 659, 432; 437/53

[56] References Cited

U.S. PATENT DOCUMENTS 5,250,825  10/1993  Negishi et al. ........................ 257/232

FOREIGN PATENT DOCUMENTS

| 0441594 | 8/1991 | European Pat. Off. . | |
|---|---|---|---|
| 2335053 | 7/1977 | France . | |
| 2156670 | 6/1990 | Japan . | |
| 2-237068 | 9/1990 | Japan ................................. | 257/233 |
| 3276677 | 6/1991 | Japan . | |
| 3191302 | 8/1991 | Japan . | |
| 3194969 | 8/1991 | Japan . | |
| 4116976 | 4/1992 | Japan . | |

*Primary Examiner*—Ngân V. Ngô
*Attorney, Agent, or Firm*—Rogers & Wells

[57] ABSTRACT

A first P-type diffusion layer is formed on a semiconductor substrate. A photodiode is formed thereon. A transfer channel is formed on the semiconductor substrate. Agate insulating film is grown from a silicon oxide film on the semiconductor substrate. A transfer gate electrode is formed on the gate insulating film by patterning polysilicon. A light-shielding film of a metallic evaporation film is formed on the transfer gate electrode so that light cannot enter the transmission channel only to be a smear component. A difference in level of about 2 to 4 μm is formed on the semiconductor substrate of the transfer channel due to the transfer gate electrode and the light-shielding film. An underlying smooth layer is formed to smooth the surface difference in level, and a first light-shielding layer is formed on it. A transparent film is formed on it, and a third light-shielding layer is formed via a second light-shielding layer and a transparent film. Further, a transparent film having the same material and the same film thickness as the above transparent film covers the third light-shielding layer, and then is smoothed. An on-chip lens is formed on it. Thus, a negative influence of a flare light can be prevented.

13 Claims, 11 Drawing Sheets

(PRIOR ART)

FIG. 23

(PRIOR ART)

FIG. 24

(PRIOR ART)

FIG. 25

ON-CHIP SCREEN TYPE SOLID STATE IMAGE SENSOR AND MANUFACTURING METHOD THEREOF

BACKGROUND OF THE INVENTION

1. Field of the Invention

The present invention relates to solid state image sensors having a plurality of light-shielding layers, and manufacturing methods of such sensors.

2. Description of the Related Prior Art

One recent means for making a solid state image sensor colorable is a filter bonding method which bonds a color film layer formed on a plate glass to a solid state image sensing device. However, to deal with more complicated manufacturing processes and further advanced devices' minuteness, the above method has gradually been superseded by a so-called on-chip color filter method which forms a color filter layer directly on a semiconductor substrate carrying the solid state image sensing device. In addition, especially for a compact solid state image sensor, a micro lens, which focuses incident light onto a light-receiving portion, is mounted on the color filter layer, improving light-receiving sensitivity.

Figure 23:
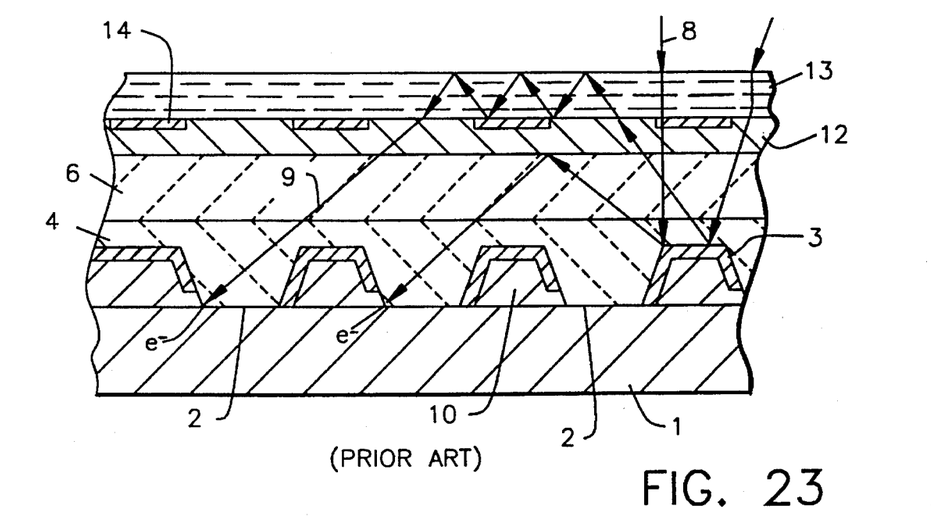
FIG. 23 shows a sectional view of a conventional solid state image sensor.

A description will now be given of conventional solid state image sensors. FIG. 23 shows a sectional view of a principal part of the conventional solid state image sensor, giving an example of the color filter bonding method.

A semiconductor substrate 1 carrying the solid state image sensing device has a terribly rough surface; accordingly, the surface is first smoothed by an underlying smooth layer 4 and then a transparent layer 6 is mounted on it, Subsequently, a color filter 13 is bonded onto it via a color filter bonding layer 12. A light-shielding layer 14, which comprises a light-absorption layer or a light-reflection layer formed on a plate glass surface of the color filter 13, is arranged so as to coat a vertical CCD 10 and shield stray light (referred to hereinafter as flare light) from entering a photodiode 2. Incident light 8 transmitting through an optical system of a video camera reaches the photodiode 2 via the color filter 13, and its optical energy is converted into an electric signal.

Figure 24:
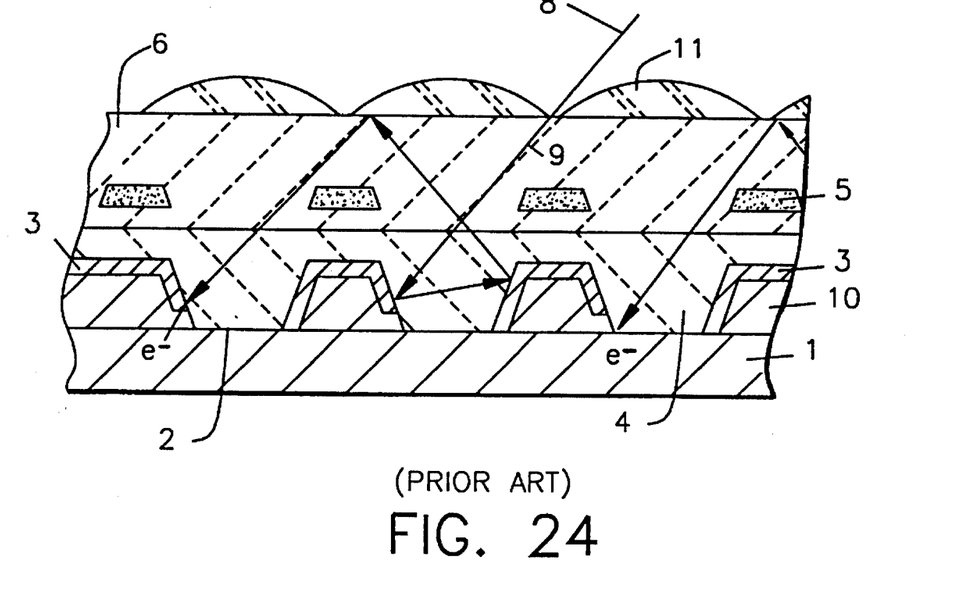
FIG. 24 shows a sectional view of another conventional solid state image sensor.
Figure 25:
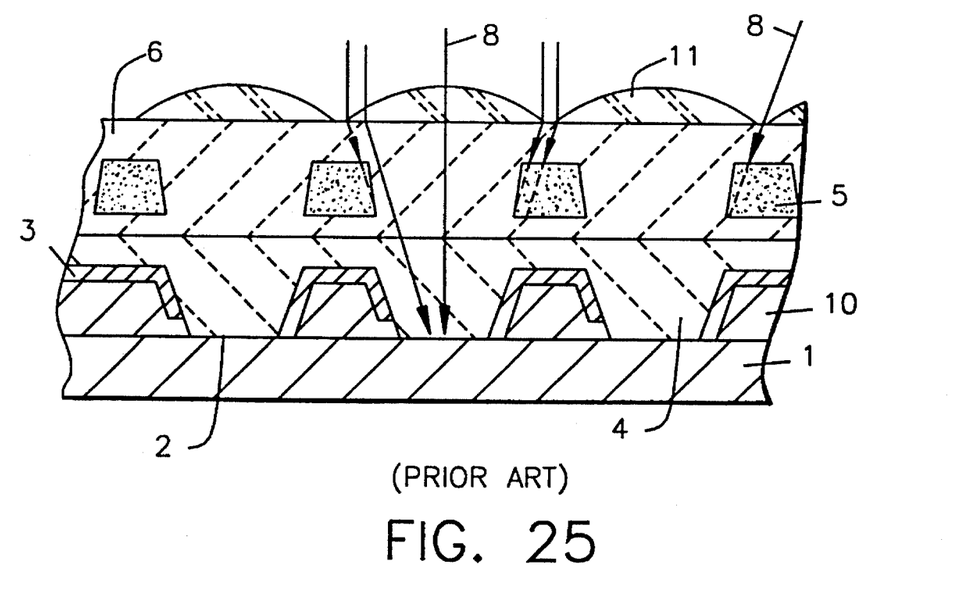
FIG. 25 shows a sectional view of still another conventional solid state image sensor.

FIGS. 24 and 25 each show sectional views of principal parts of other conventional solid state image sensors, taking examples of the on-chip filter method.

In general, according to the on-chip filter method, the underlying smooth layer 4, a light-shielding layer 5, a transparent film 6, and a focus lens 11 (referred to hereinafter as an on-chip lens) are stacked, as shown in FIG. 24, on the semiconductor substrate 1 which carries the solid state image sensing device. The incident light 8 focused by the on-chip lens 11 is thus efficiently led to the photodiode 2. The light-shielding layer 5 formed in the transparent film 6 shields flare light as internal reflection light 9 from being taken as spurious signals in the photodiode 2.

FIG. 25 shows a solid state image sensor which has the light-shielding layer 5 thicker than that of the conventional solid state image sensor shown in FIG. 24, and is designed to more completely shield flare light by controlling the thickness. However, the above conventional constructions have the following disadvantages, and thus cannot shield flare light satisfactorily:

According to the solid state image sensor employing the filter bonding method shown in FIG. 23, an obliquely entering beam of the incident light 8 is reflected by the light-shielding film 3, then repeatedly reflected on the color filter 13 and/or in the transparent film 6 and finally, unexpectedly reaches the photodiode 2 only to cause a spurious signal.

According to the solid state image sensor employing the on-chip filter method shown in FIG. 24, the light-shielding layer 5 cannot satisfactorily absorb and shield, due to its thin single layer construction, flare light generated from the obliquely entering light 8; the flare light is repeatedly reflected in the shielding film 3 or the like, and unexpectedly reaches the photodiode 2 only to cause a spurious signal.

On the other hand, the solid state image sensor employing the on-chip filter method shown in FIG. 25 can successfully absorb and shield the obliquely entering light 8 due to the thick light-shielding layer 5 of a light-absorption layer. Nevertheless, a beam of the incident light 8 which has transmitted through the circumference of the on-chip lens 11 is shielded by the thick light-shielding layer 5; as a consequence, even light expected to enter the photodiode 2 is absorbed, which lowers sensitivity. Besides, in an attempt to form the light-shielding layer 5 by photolithography, a negative type of natural protein material, generally used for the lithography, cannot be fully resolved as the light-shielding layer 5 requires a thicker film thickness, which facilitates the film remainder of the light-shielding layer 5. Consequently, the photodiode 2 is partially covered at its circumference, and lowered in sensitivity. Further, the thick light-shielding layer 5 sometimes induces material to be melted in a development process subsequent to an exposure process, and causes a blotted image.

The present invention overcomes the above conventional disadvantages; it is an object of the present invention to provide a solid state image sensor and a manufacturing method of it, which sensor forms high quality of images by successfully shielding flare light generated from obliquely entering light and internal reflection light, and eliminating spurious signals.

SUMMARY OF THE INVENTION

To achieve the above object, a solid state image sensor according to the present invention comprises a light-shielding layer formed outside a photodiode region of a solid state image sensing device on a semiconductor substrate which carries the solid state image sensing device, and a smooth layer formed on the light-shielding layer, and two or more light-shielding layers formed on the smooth layer.

A method for manufacturing a solid state image sensor according to the present invention comprises the following steps of forming a photodiode region and a vertical CCD in a matrix form on a semiconductor substrate, forming a transfer gate electrode on the vertical CCD on the semiconductor substrate via an insulating film, forming a light-shielding film on the transfer gate electrode, forming an underlying smooth layer for smoothing the semiconductor substrate surface, forming a first light-shielding layer on the underlying smooth layer on the transfer gate electrode, forming a first transparent film on the first light-shielding layer and smoothing the first transparent film, forming a second light-shielding layer on the first transparent film, and forming a second transparent film on the second light-shielding layer and smoothing the second transparent film.

A method for manufacturing a solid state image sensor according to the present invention comprises the following steps forming a photodiode region and a vertical CCD in a matrix form on a semiconductor substrate, forming a transfer gate electrode on the vertical CCD on the semiconductor substrate via an insulating film, forming a light-shielding film on the transfer gate electrode, forming an underlying smooth layer for smoothing the semiconductor substrate surface, forming a first light-shielding layer on the underlying smooth layer on the transfer gate electrode, forming a first transparent film on the first light-shielding layer and smoothing the first transparent film, forming a second light-shielding layer on the first transparent film, forming a second transparent film on the second light-shielding layer and smoothing the second transparent film, forming a third light-shielding layer on the second transparent film, forming a third transparent film on the third light-shielding layer and smoothing the third transparent film, and forming a micro lens on the third transparent film.

The above construction can efficiently shield and absorb flare light which is easily induced by light obliquely entering the solid state image sensor or incident light reflected in a light-shielding metal layer. In addition, the above construction can provide, even when applied to a solid state image sensor equipped with an on-chip lens, high quality of images, since it neither decreases focused light amount, nor generates development blotting even when thickening the light-shielding layer's film thickness.

DESCRIPTION OF THE PREFERRED EMBODIMENT

A description will be given of preferred embodiments according to the present invention, with reference to the accompanying drawings.

Figure 1:
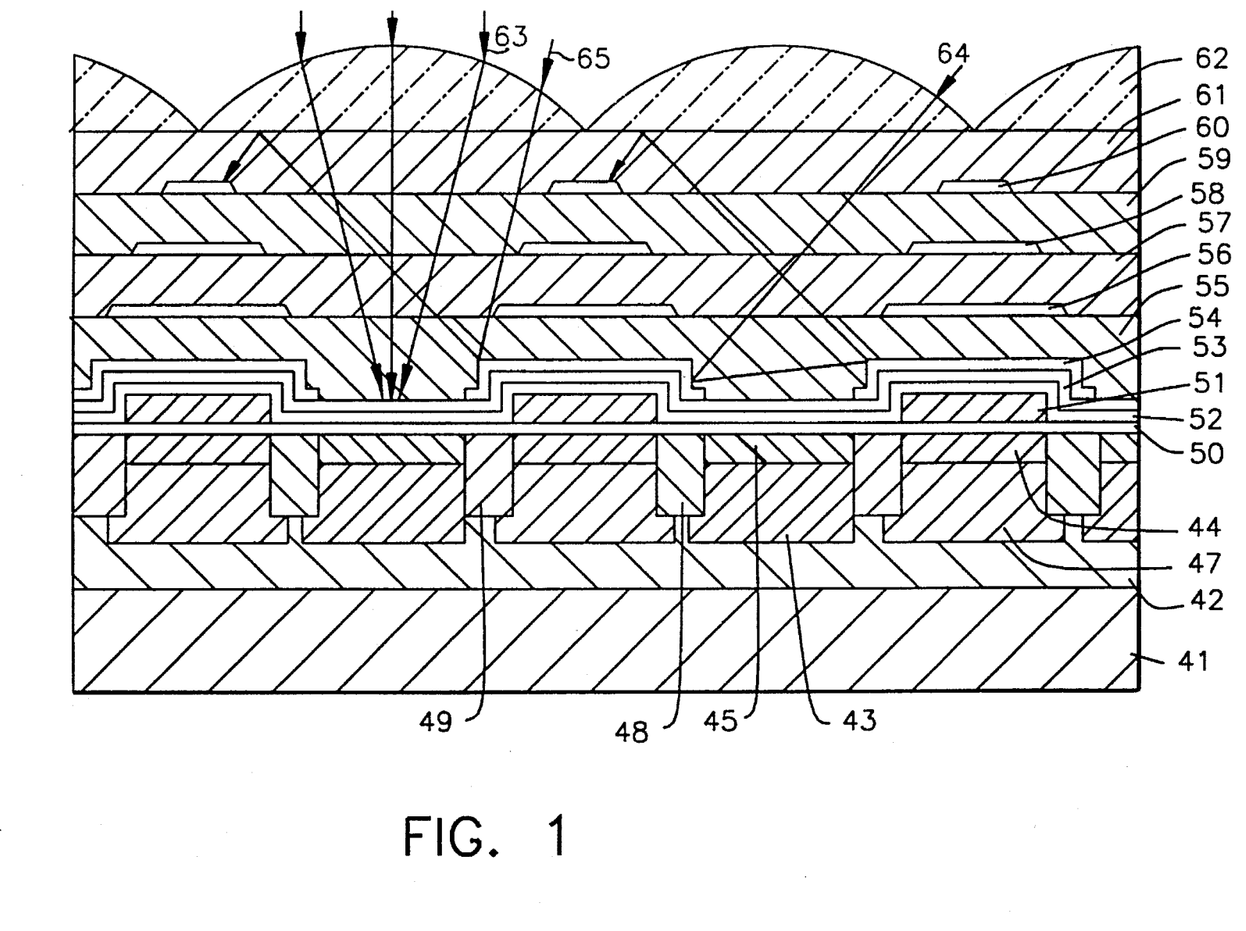
FIG. 1 shows a sectional view of a principal part of a solid state image sensor of a first embodiment according to the present invention.

FIG. 1 shows a sectional view of a principal part of a solid state image sensor of a first embodiment according to the present invention, giving an example Of the on-chip filter method.

A description will now be given of the sectional view of a CCD (charge-coupled device) type of the solid state image sensor manufactured in accordance with FIG. 1:

A N-type semiconductor substrate 41 has the surface direction (100) and impurity density of about $10^{14}$ cm$^{-3}$. A first P-type diffusion layer 42 is formed on the N-type semiconductor substrate 41. The first P-type diffusion layer 42 has a depth of about 5 μm and impurity density of about $10^{15}$ cm$^{-3}$. The first P-type diffusion layer 42 is provided in order to exhaust electric charges unnecessary for a photodiode 43. The photodiode 43 is formed as a N-type diffusion layer on the N-type semiconductor substrate 41. The photodiode 43 forms electric charges (photocarrier) by incident light from the exterior, and temporarily accumulates them therein. Electric charges generated more than the accumulateable charge amount for the photodiode 43 become streamed from the photodiode 43 to the other areas. An electric charge entering a transfer channel 44 of an N-type diffusion layer occasions blooming. Such blooming is restrainable by the first P-type diffusion layer 42. The first P-type diffusion layer 42 is fixed at zero voltage. Therefore, a potential profile in these areas is maintained constant because electric charges generated in the photodiode 43 are exhausted to the N-type semi-conductor substrate 41 through the first P-type diffusion layer 42. The impurity density of the first P-type diffusion layer 42 set to the aforementioned value can easily induce a depletion layer in the photodiode 43, as the solid state image sensor is activated, and increase the photoelectric conversion signal amount. The depth of the first P-type diffusion layer 42 is determined by the depth of the photodiode 48 and the withstand voltage therebetween. The photodiode 43 needs a depth of at least about 2 μm to obtain the sufficient photoelectric conversion efficiency when receiving light within the visible light range.

The first P-type diffusion layer 42 thus includes thereon the N-type diffusion layer of the photodiode 43. Light entering the photodiode 43 induces electron-hole pairs in the depletion layer in the photodiode 43. An electron becomes a signal charge via the adjacent transfer channels 44. A hole is exhausted outside the N-type semiconductor substrate 41 through the first P-type diffusion layer 42. The photodiode 43 thus converts incident light into a signal charge. A second P-type diffusion layer 45 is formed on the surface of the photodiode 43.

Hereupon, the reason why the second P-type diffusion layer 45 is formed will be explained: When the N-type diffusion layer of the photodiode 43 is formed in contact with a surface boundary between the semiconductor substrate 41 and a gate insulating film 48, current occurs due to the influence of the level at the surface boundary and aggravates the device characteristic. Accordingly, the second P-type diffusion layer 45 having relatively high impurity density is formed so that the depletion layer cannot extend to the boundary surface between silicon and the insulating film. The second P-type diffusion layer 45 requires boron having impurity density above $10^{17}$ cm$^{-3}$. In an attempt to create such impurity density by the usual ion injection method, the ion injection generates an injection defect on the surface of the semiconductor substrate 41 and causes leakage current. Consequently, the satisfactory improvement cannot be effected despite an attempt to prevent the dark current generation. One method for preventing the injection defect caused by the ion injection is hydrogen annealing. Nevertheless, this method is ineffective and instable because a hydrogen atom which is introduced in the semiconductor substrate 41 by the hydrogen annealing runs away from a surface boundary between the silicon substrate and an oxidic film when heat and/or light are applied to the semiconductor substrate 41. Therefore, the device manufactured in this method has low reliability.

The first P-type diffusion layer 42 includes therein a third P-type diffusion layer 47. The third P-type diffusion layer 47 operates to prevent electric charges which causes noises for signals generated in the N-type semiconductor substrate 41, from diffusing towards the transfer channel 44. Hereupon, the third P-type diffusion layer 47 has a diffusion depth of 1 μm, and impurity density of $10^{16}$ cm$^{-3}$. The third P-type diffusion layer 47 is used to enclose the transfer channel 44 of the N-type diffusion layer. Such a construction is generally referred to as a Hi-C construction. When the diffusion depth of the third P-type diffusion layer 47 is made deeper by heat treatment, the lateral diffusion progresses simultaneously. Therefore, the third P-type diffusion layer 47 penetrates into the N-type diffusion layer of the photodiode 43. When the photodiode 43 is penetrated by the third diffusion layer 47, its photoelectric conversion output becomes lowered. The transfer channel 44 is a transfer area for transferring signal charges formed in the photodiode 43 to the predetermined area.

The transfer channel 44 has a diffusion depth of about 0.5 μm, and the impurity density of $10^{16}$ to $10^{17}$ cm$^{-3}$.

To achieve the Hi-C construction, the third P-type diffusion layer 47 need to be made wider than the transfer channel 44.

When a signal charge generated in the photodiode 43 is read out to the transfer channel 44, the potential of the transfer channel 44 is made lower than that of the photodiode 43. In addition, a signal charge formed in the photodiode 43 must be controlled not to flow in the transfer channel 44, in a case where a signal charge carried to the transfer channel 44 is flowed backward to the photodiode 43 or where a signal charge exists in the transfer channel 44. Accordingly, a fourth P-type diffusion layer 48 for controlling the potential at reading time is provided between the photodiode 43 and the transfer channel 44. When a signal charge is transferred from the photodiode 43 to the transfer channel 44, the potential in the fourth P-type diffusion layer 48 is controlled to be made lower than that of the photodiode 43, and as high as or higher than that of the transfer channel 44. When a signal charge is accumulated in the transfer channel 44, the potential of the fourth P-type diffusion layer 48 is controlled to be made higher than that of the photodiode 43 and that of the transfer channel 44 so that the signal channel cannot flow backward to the photodiode 43.

The fourth P-type diffusion layer 48 has a diffusion depth of about 1 μm, and surface density of $10^{16}$ to $10^{17}$ cm$^{-3}$ on the surface of the silicon substrate 41. At voltage of 0 V or 15 V of a driving pulse which activates the solid state image sensor, an electric charge must be prevented from flowing backward from the transfer channel 44 to the photodiode 43, or the electric charge must be made flow from the photodiode 43 to the transfer channel 44. The diffusion depth and the impurity density of the fourth P-type diffusion layer 48 are respectively set so that in both states they can be the threshold voltage which give the optimal potential profiles. Preferably, the width of the fourth P-type diffusion layer 48 is set below 1 μm. The width above 1 μm of the fourth P-type diffusion layer 48 lowers the transistor's gm characteristic; the lowered gm characteristic makes it impossible to completely read out signal charges accumulated in the photodiode 43. On the contrary, the width below above 1 μm of the fourth P-type diffusion layer 48 creates a short channel effect. The short channel effect facilitates the punch through generation; consequently, a small photoelectric conversion output value of the photodiode becomes small.

The solid state image sensor includes a matrix form of a pair of the photodiode 43 and the transfer channel 44. A fifth P-type diffusion layer 49 is formed in order to electrically separate the adjacent pairs. The fifth P-type diffusion layer 49 is formed by the ion injection. The fifth P-type diffusion layer 49 has a depth of about 1 μm and surface density of $10^{17}$ to $10^{18}$ cm$^{3}$.

The surface density of the fifth P-type diffusion layer 49 must be set in the above range so that signal charges accumulated in the abutting photodiode 43 cannot be flowed in the abutting photodiodes 43. The surface density below $10^{17}$ cm$^{-3}$ allows signal charges in the abutting photodiodes 43 to flow. The surface density above $10^{18}$ cm$^{-3}$ creates a narrow channel effect in the abutting transfer channel 44. The narrow channel effect lowers the transfer capacity of the transfer channel 44 and, accordingly, the dynamic range of the solid state image sensor, and aggravates the transfer efficiency.

Preferably, the width of the fifth P-type diffusion layer 49 is set below about 1 μm. The width above 1 μm of the fifth P-type diffusion layer 49 narrows the transfer area of the transfer channel 44: Namely, signal charges accumulated in the photodiode 43 cannot be completely read out. The width below 1 μm of the fifth P-type diffusion layer 49 creates a short channel effect. The short channel effect facilitates the punch through generation between the photodiode 43 and the transfer channel 44. Consequently, information of adjacent photodiodes 43 is erroneously read out and the resolution becomes lowered; the output of the photodiode 43 becomes also lowered.

A gate insulating film 50 is grown from a silicon oxidic film on the N-type semiconductor substrate 41. The gate insulating film 50 is formed by a pyro-oxide method. The gate insulating film 50 has a film thickness above 50 nm. Preferably, the film thickness of the gate insulating film 50 is made above 50 nm to improve the transfer efficiency by using a fringing effect.

A transfer gate electrode 51 is formed by patterning polysilicon which has been grown by the pressure-reduction CVD method. The transfer gate electrode 51 has sheet resistance of over 10 Ω and a film thickness of about 500 nm. The transfer gate electrode 51 is used as an electrode which applies the driving pulse for reading out signal charges formed in the photodiode 43 and transmits them to the transfer channel 44. Thus, preferably, the resistance of the transmission electrode 51 is made as low as possible. Should the phosphor doping amount increased in order to lower the resistance, there would be lowering of the withstand voltage of an interlayer film 52 which has been formed by oxidizing surface of the transfer gate electrode 51. Therefore, the phosphor doping amount must be set in the above value. The interlayer film 52 made of polysilicon oxidic film is grown on the surface of the transfer gate electrode 51.

The interlayer film 52 is grown by oxidizing the surface of the transfer gate electrode 51 in accordance with the pyrooxidic method. The film thickness of the interlayer film 52 is set at about 200 nm. The interlayer film 52 is formed in order to maintain the interlayer film's withstand voltage. Incidentally, the etching remainder of the polysilicon film generated as a result of the etching for forming the transfer gate electrode 51 causes leakage voltage therethrough when driving voltage is applied thereto. The leakage can be checked by burning the polysilicon etching remainder when the interlayer film 52 is formed. Since the four-phase driving pulse applied to the transfer gate electrode 51 changes among levels of −7V, 0V, and +15V, the interlayer film 52 has the withstand voltage for the maximum voltage difference above 22V.

An interlayer film 53 of a silicon oxidic film is formed on the surface of the interlayer film 52. The interlayer film 53 has a film thickness of about 100 nm. The interlayer film 53 is formed by the CVD method. The interlayer film 53 is formed in order to prevent pinholes or the like from generating in the polysilicon oxide film of the interlayer film 52 and from weakening the withstand voltage partially.

A light-shielding film 54 is formed from a metallic evaporation film, such as an aluminum film, in order to prevent light from entering the transfer channel 44 and becoming a smear component. As described above, a difference in level of about 2 to 4 μm is formed on the semiconductor substrate 41 of the transfer channel 44 due to the transfer gate electrode 51 and the light-shielding film 54. An underlying smooth layer 55 is formed in order to smooth the surface difference in level. A first light-shielding layer 56 is stacked on it. The underlying smooth layer 55 employs a transparent acrylic resin having a film thickness of 3 to 5 μm. A first light-shielding layer 56 formed on the underlying smooth layer 55 may also employ a layer mainly made of acrylic resin; accordingly, before the first light-shielding layer 56 is fabricated and after the underlying smooth layer 55 is formed, the underlying smooth layer 55 is baked and fired at the temperature of about 200° C. so as not to be transformed. The underlying smooth layer 55 must be smoothed enough to form the light-shielding layer thereon with high precision; as to the roughness on the surface after the underlying smooth layer 55 is formed, a difference between a concave bottom surface and a convex top surface is kept below 0.1 μm. The difference of more than 0.1 μm causes the upper light-shielding layer's pattern a biased light-shielded area distribution according to positions. As a result, the finished solid state image sensor comes to have the resolution deviated according to the position. The light-shielding layer 56 employs gelatin, casein, and/or acrylic resin dyed black. Thus, the first light-shielding layer 56 uses an organic film, i.e., a negative type of a responsive organic film formable by normal lithography. Gelatin and casein are exposeable by g ray in photolithography, however low in resolution. Therefore, they cannot effect the patterns' minuteness associated with the devices' minuteness, and their low resolution affects regions other than desired region. The present embodiment uses an acrylic resin. The acrylic resin is transparent resin unresponsive to light. Diazo-compound and dimethyl amino ethyl methacrylate (DMAEMA) are added to acrylic copolymer; thus, the addition of a chromatic radical makes the acrylic resin stainable. Thereby, the first light-shielding layer 56 becomes stainable, and a negative type of material responsive to i ray in the photolithography. The effective patterns' minuteness associated with the devices' minuteness can be thus achieved, and the resolution can be improved. Furthermore, when gelatin and casein are dyed black, material including a main component of chromic acid is employed and negatively affects the environment, i.e., causes environmental pollution. On the other hand, since the acrylic resin does not employ such material, it does not exert a baneful influence upon the human body and thus is safe.

The first light-shielding layer 56 is formed so as not to interrupt light entering the photodiode 43. The present embodiment gives the first light-shielding layer 56 a film thickness of 0.3 μm through 0.5 μm. Hereupon, the film thickness cannot be set above 0.8 μm. This is because the acrylic resin is a negative type which absorbs developer during development and results in so-called swelling, i.e., a pattern's distention. Although the swelling can be removed by rinse after development and the resin is shrunk, the film thickness above 0.8 μm triggers an uneven pattern during shrinkage. Besides, scum, a stripe peculiar to the negative type, is also formed during development. Such scum is formed at an area which is not expected to be light-shielded. Consequently, due to the swelling and the scum, the finished solid state image sensor comes to have deviated sensitivity and form a blurred image. To prevent this, the film thickness need be set below 0.8 μm. In addition, the sectional width of the first light-shielding layer 56 is determined so as to cover the light-shielding film 54 and not to block a light focusing path for the on-chip lens, and is made 2 μm herein.

A transparent film 57 is formed on it, and a second light-shielding layer 58, a transparent film 59, and a third light-shielding layer 60 are stacked on the transparent film 57. The transparent films 57, 59 are made by firing transparent acrylic resin. Each of the transparent films 57, 59 has a film thickness of 0.5 to 2 μm, and smooths the substrate surface. Each of the second and third light shielding layers 58, 60 employs the same material and the same film thickness as those of the first light-shielding layer 56. Each sectional area of the second light-shielding layer 58 and the third light-shielding layer 60 is made small enough not to shield the light focusing path of the on-chiplens; the more upwardly the light-shielding layer is located, the smaller sectional area it has. The third light-shielding layer 60 is covered with a transparent film 61 having the same material and the same film thickness as those of the transparent film 57. The on-chip lens 62 is formed on it.

Because of the above construction, light 63 incident onto the on-chip lens 62 in a direction perpendicular to the photodiode 43 enters the photodiode 43 through the micro lens 62, the transparent films 57, 59, 61, and the underlying smooth layer 56. Such light 63 directly reaches the photodiode 43, whereas some light 64, 65 incident to the micro lens 62 in directions oblique, with acute angles, to the surface of the semiconductor substrate 41 do not reach the photodiode 43. The obliquely entering light 64, 65 is refracted by the lens and the transparent films, and their optical paths proceed to the transfer gate electrode 51. Finally, they reach the transparent film 54 on the transfer gate electrode 51 and are reflected by it. The reflected light is transmitted through the underlying smooth layer 55 and the transparent films 57, 59, 61, reflected at the boundary between the transparent film 61 and the micro lens 62, and the reflected light enters as flare light into the adjacent photodiodes 43. Since the present embodiment arranges the light-shielding layers 56, 58, 60 outside the optical path of the light 63 which directly transmits from the micro lens 62 to the photodiode 43, these light-shielding layers can successfully shield and/or absorb reflected light and prevent the flare light generation.

Figure 2:
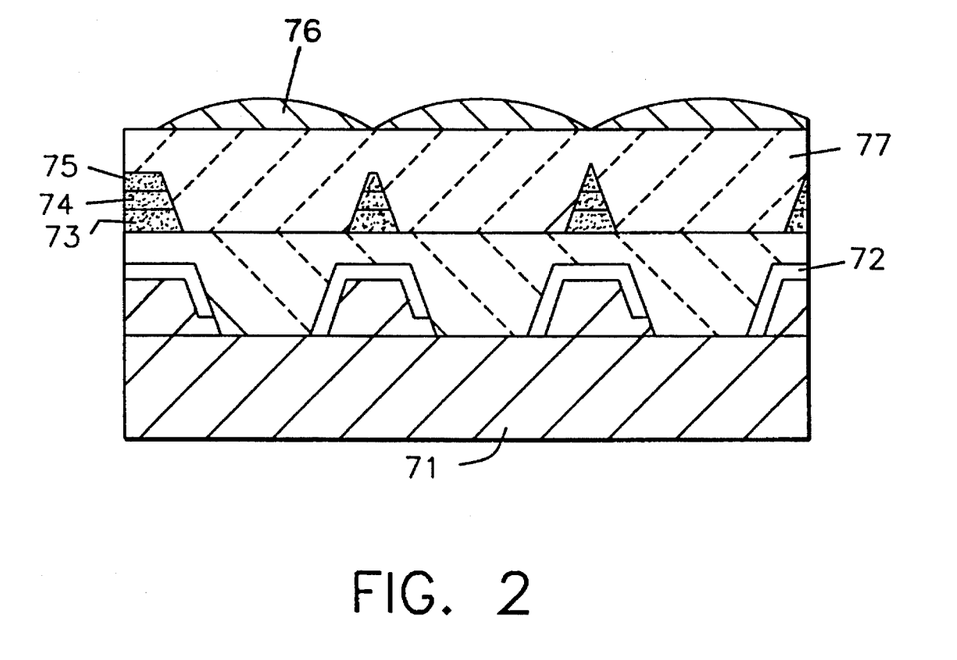
FIG. 2 shows a sectional view of a principal part of a solid state image sensor of a second embodiment according to the present invention.

FIG. 2 shows a sectional view of a principal part of a solid state image sensor of a second embodiment according to the present invention.

It is similar to the first embodiment in that the respective diffusion layers are formed on a semiconductor substrate 71 and a transparent film 72 is formed on the transfer gate electrode on the semiconductor substrate 71. What is different from the first embodiment is that a second light-shielding layer 74 and a third light-shielding layer 75 are directly formed on a first light-shielding layer 73 without intervening transparent films therebetween. As to layers above the second light-shielding layer 74, the more upwardly the layer is located, the smaller sectional area it has so as not to shield the light focusing path of the on-chip lens 76. Each of light-shielding layers 73, 74, 75 may have the same material and the same film thickness as those disclosed in the first embodiment. However, since the three light-shielding layers 73, 74, 75 form a multilayer construction and a large difference in level, such as 1.5 to 6 μm, a transparent film 77 having the corresponding film thickness of 2.5 to 7 μm for smoothing the substrate surface is provided before the on-chip lens 76. Advantageously, the second embodiment has steps fewer than the first embodiment. However, since the second and third light-shielding layers 74, 75 occasion a large difference in level and deteriorate the formed light-shielding layers' patterning precision, the second embodiment is not very effective on the minute patterning.

As mentioned above, since the first and second embodiments arrange three light-shielding layers along the optical paths transmitting through the on-chip lenses 62, 76, even light not entering the photodiode 43 and scattered in the interior does not result in flare light invading the adjacent photodiodes 43. Therefore, uneven sensitivity and blurred images never occur.

The reason why the first and second embodiments employ three light-shielding layers is determined by the light-shielding performance. As mentioned above, each light-shielding layer can employ its film thickness of 0.8 μm at most due to the restriction of the formation process. A single light-shielding layer which has the film thickness of 0.8 μm and is made of acrylic resin can shield 60% light against the incident light strength. On the other hand, when three light-shielding layers are used as discussed by the present embodiments, light transmitting through the three light-shielding layers can be reduced to almost 0.4% of the incident light. Thus, the number of the stacked light-shielding layers is determined by taking the required precision into account.

Figure 3:
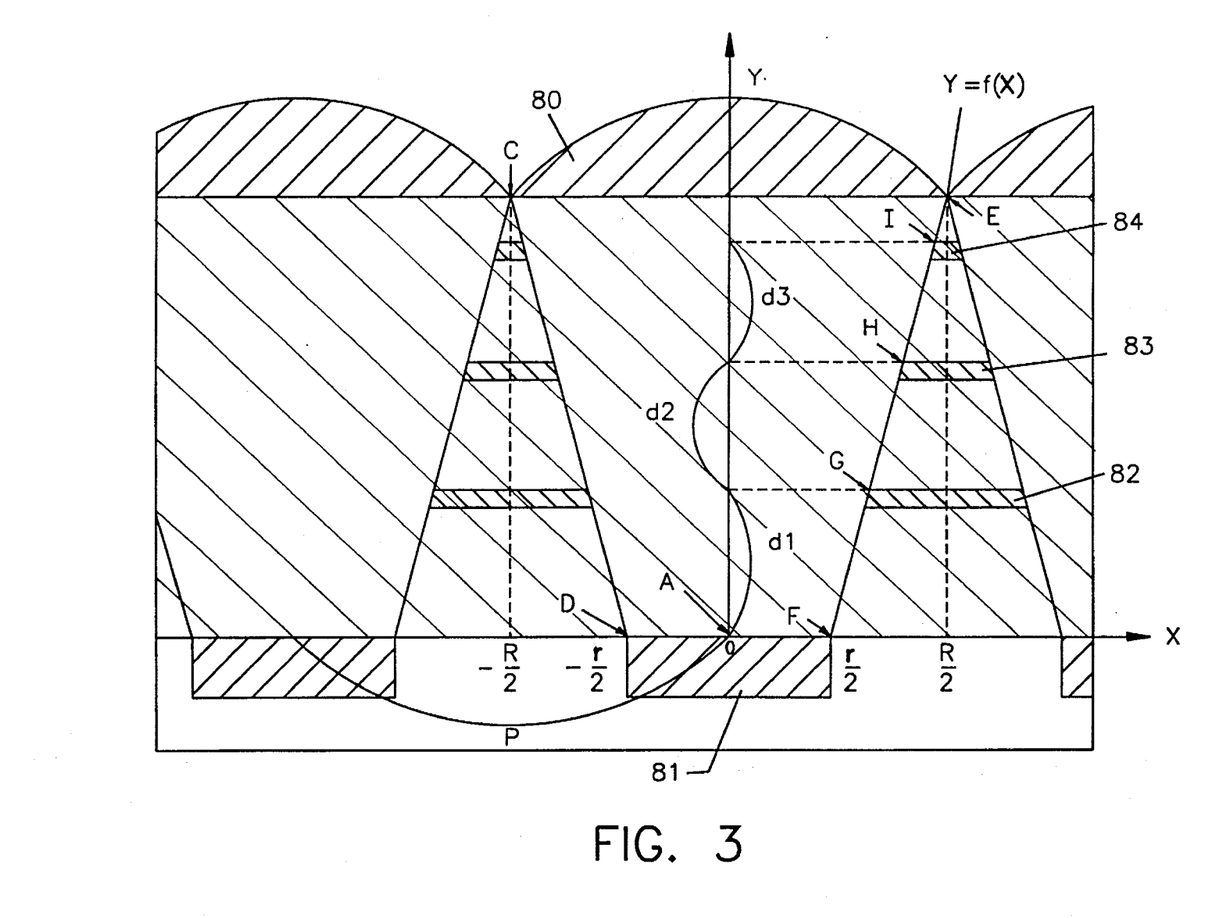
FIG. 3 shows a view for explaining arrangement of light-shielding layers.

Next follows, with reference to FIG. 3, a description of an arrangement of the light-shielding layers. The drawing shows a sectional view of a part corresponding to one picture element (pixel) of the solid state image sensor. A light emitted from the subject enters a micro lens 80 through an aperture. There are various kinds of light entering the micro lens 80: light entering in a direction perpendicular to the substrate, and light entering with an arbitrary angle with respect to the direction perpendicular to the substrate. The arbitrary angle is determined by the optical path of a light coming from the aperture. The light incident in the perpendicular direction transmits through the micro lens 80 and creates an image forming point "A" at a focal point on a surface of the photodiode 81. The focus can be achieved by adjusting a distance between the surface of the photodiode 81 and the micro lens 80, or changing a curvature of the micro lens 80. On the other hand, the light obliquely entering with an arbitrary angle with respect to the perpendicular direction forms an image apart from the image forming point "A" focused by the light entering in the perpendicular direction. Considering all such rays of light, a width of the photodiode is determined, as shown in the drawing, so as to cover the area of the image forming points focused by the light: Any light definitely transmits through an area held by segments CD, EF from both ends of the micro lens 80 to both ends of the photodiode. Therefore, the light-shielding layer must be located along and outside these segments. Hereupon, the segment EF is expressed by the following equation, with respect to a center of the photodiode 81 as an origin:

$$Y = [L(2X-r)]/(R-r)$$

wherein "r" is the width of the photodiode 81; "R" is a width of the micro lens 80; and "L" is a distance between the upper surface of the photodiode 81 and the bottom surface of the micro lens 80.

Thereby, each position of edges G, H, I over the substrate is respectively determined with respect to the origin as follows: $[d1(R-r)+rL]/2L$, $[(d1+d2)(R-r)+rL]/2L$, $[(d1+d2+d3)(R-r)+rL]/2L$ wherein "d1" is a height from the upper surface of the photodiode to the edge G which is located at an upper portion of the first light-shielding layer 82 and at the side of the photodiode; "d2" is a height from the edge G to the edge H which is located on the second light-shielding layer 83 and at the side of the photodiode; "d3" is a height from the edge H to the edge I which is located on the third light-shielding layer 84 and at the side of the photodiode; and "P" is a distance between center points of the two adjacent micro lenses 80. Preferably, each width W of the light-shielding layers is determined by calculating the difference from the similar equations as follows: The width of the first light-shielding layer 82 is [d1(R-r) +L(P-R)]/L; the width of the second light-shielding layer 83 is [(d1+d2) (R-r)+L(P–R)]/L; and the width of the third light-shielding layer 84 is [(d1+d2+d3) (R-r)+L(P-R)]/L. Hereupon, "R" is a distance between two abutting micro lenses 80: Namely, an edge of one micro lens 80 is in contact with another edge of the abutting micro lens 80.

Figure 4:
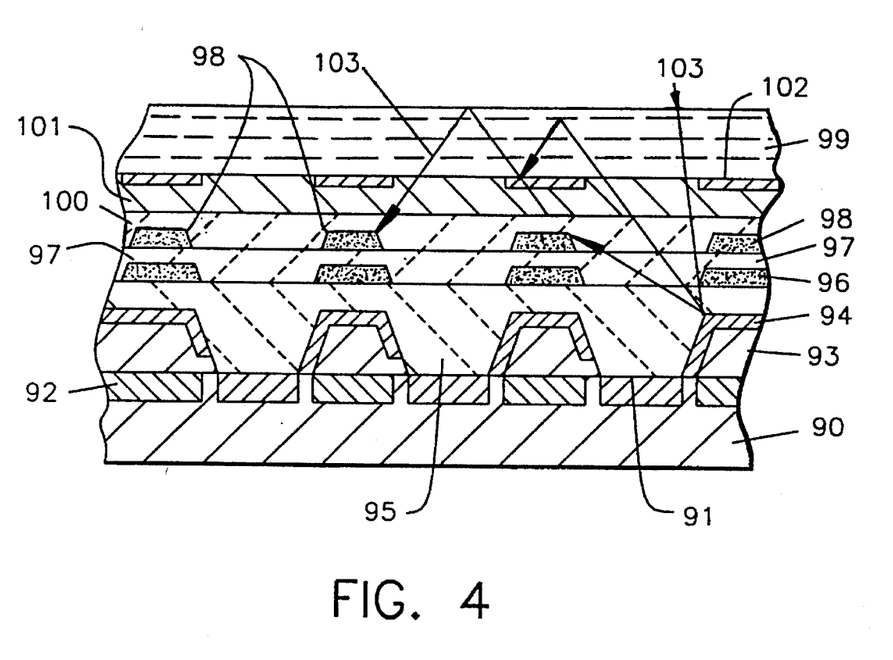
FIG. 4 shows a sectional view of a principal part of a solid state image sensor of a third embodiment according to the present invention.

FIG. 4 shows a sectional view of a principal part of the solid state image sensor of a third embodiment according to a present invention, giving an example of the filter bonding method. The description refers to a construction after the light-shielding layers have been formed. The semiconductor substrate 90 includes a photodiode 91 and a vertical CCD portion 92. Stacked on the semiconductor substrate 90 are the transfer gate electrode 93 and the light-shielding layer 94. An underlying smooth layer 95 is formed in order to smooth the surface difference in level on the semiconductor substrate 90; a first light-shielding layer 96 is formed on it so as not to interrupt light entering the photodiode 91. Preferably, the first light-shielding layer 96 has a sectional width large enough to cover the light-shielding layer 94, and the first light-shielding layer 96 has a thickness below 0.8 μm so as to prevent blotting of after development. Stacked on the first light-shielding layer 97 are a transparent film 97 and a second light-shielding layer 98 so as not to interrupt light entering the photodiode 91. Since a main beam transmitting through a color filter 99 is approximately normal to the color filter 99, the sectional width of the light-shielding layers above the second may somewhat be smaller than the first light-shielding layer 96. Preferably, the second light-shielding layer 98 has a thickness below 0.8 μm so as not to generate blotting after development. A transparent film 100 is formed covering the second light-shielding layer 98, and a color filter 99 is bonded on it via a filter bonding layer 101. The color filter 99 is formed on a plate glass. A light-shielding layer 102 is formed on the plate glass by a chromic film. The plate glass and the semiconductor substrate 90 are adjusted in position by alignment marks provided for them, and bonded together via the filter bonding layer 101. This method is referred to as a filter glass bonding method. According to this method, unlike the first and second embodiments, since light incident to the photodiode 91 enters the substrate surface almost perpendicularly, a width of the light-shielding layer need not be varied according to positions. This solid state image sensor also receives an obliquely entering light 108. Such a light is reflected on the filter bonding layer 101 on the transfer gate electrode 93, transmitted through the underlying smooth layer 95, the transparent films 97, 100, and the filter bonding layer 101, and reflected on the upper surface of the color filter 99. The reflected light 108 enters the abutting photodiodes 91. According to this embodiment, since the light 96, 98, 102 shield and/or absorb light reflected by the light-shielding film 94 and/or light reflected on the plate glass surface, flare light never occurs.

Next follows, with reference to the drawings, a description of a method for manufacturing a solid state image sensor of one embodiment according to the present invention.

FIGS. 5 through 16 are sectional views for explaining processes in the manufacturing method.

Figure 5:
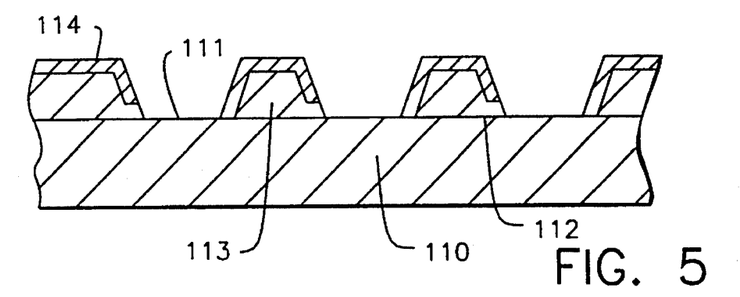
FIG. 5 shows a view for explaining steps in a method for manufacturing a solid state image sensor of a first embodiment according to the present invention.

First of all, a photodiode 111 and a vertical CCD is formed, as shown in FIG. 5, on a semiconductor substrate 110 which carries a solid state image sensor. Then, a transfer gate electrode 113 is formed on the vertical CCD 112. A light-shielding layer 114 for preventing light from entering the vertical CCD 112 is formed on the transfer gate electrode 113, covering the vertical CCD 112.

Figure 6:
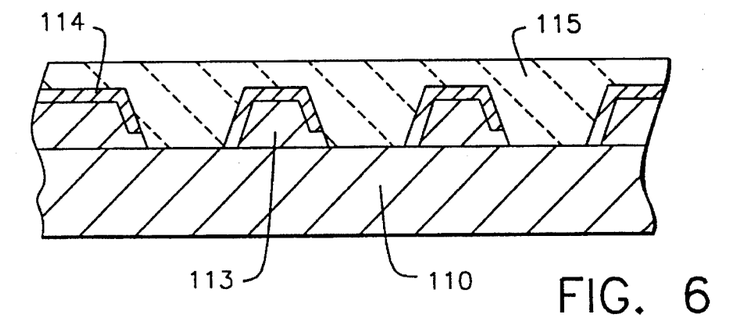
FIG. 6 shows a view for explaining other steps in the method for manufacturing the solid state image sensor of the first embodiment according to the present invention.

Next, as shown in FIG. 6, an underlying smooth layer 115 for smoothing surface roughness is formed on the surface of the semiconductor substrate 110 by applying transparent synthetic resin, such as acrylic resin having a sufficient transmission ratio for the visible light, by means of a rotation application method which sets the number of revolutions in accordance with the resin's viscosity.

Figure 7:
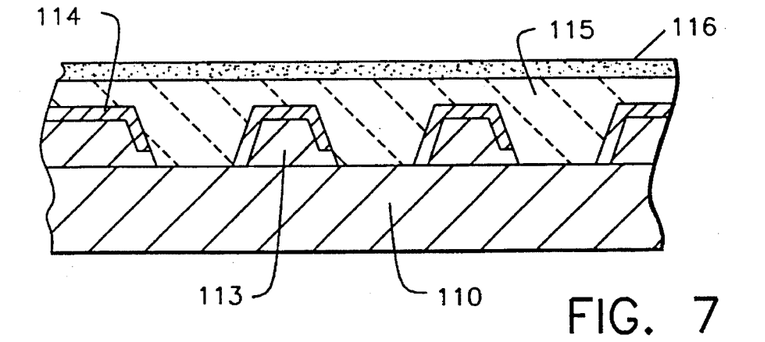
FIG. 7 shows a view for explaining other steps in the method for manufacturing the solid state image sensor of the first embodiment according to the present invention.

Then, as shown in FIG. 7, material for a first light-shielding layer 116 is applied on the underlying smooth layer 115 by the rotation application method. The material for the first light-shielding layer 115 employs natural protein including an optical-absorption coloring matter, such as gelatin and casein, or acrylic resin including an optical-absorption coloring matter. Alternatively, instead of using material including a coloring matter, stainable natural protein or synthetic resin may be rotatively applied to the underlying smooth layer 115, then dyed an optical absorbing color (generally black), and finally fixed by tannic acid and tartar emetic so as not to be decolored.

Figure 8:
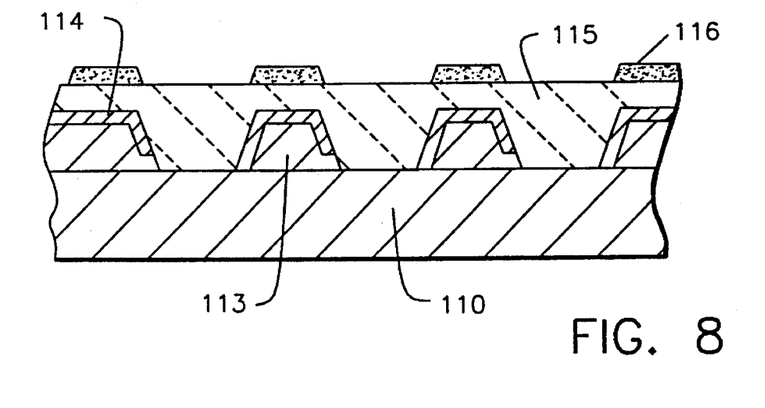
FIG. 8 shows a view for explaining other steps in the method for manufacturing the solid state image sensor of the first embodiment according to the present invention.

Subsequently, as shown in FIG. 8, a first light-shielding layer 116 is remained on the light-shielding film 114. If this process employs resin material which has been made photosensitive by adding chromic acid, diazo, and azide, the process performs the resin cross-linkage for a portion lithographically radiated by ultraviolet light and/or far-ultraviolet light, washes away the non-radiated portions by developer and rinse, and finally forms the first light-shielding layer 116. On the other hand, the process rotatively applies, when employing nonphotosensitive resin material, photo resist on material for the first light-shielding layer 116, exposes the photo resist into a desired pattern with ultraviolet light or the like, and dry-etches or wet-etches a portion having no resist pattern after development. Then, the resist remainder is burnt to ashes and removed away; the first light-shielding layer 116 having the desired pattern is thus formed.

Figure 9:
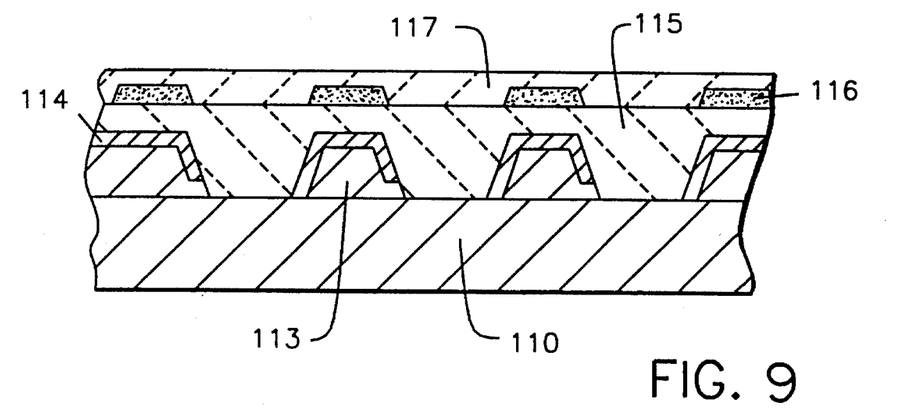
FIG. 9 shows a view for explaining other steps in the method for manufacturing the solid state image sensor of the first embodiment according to the present invention.
Figure 10:
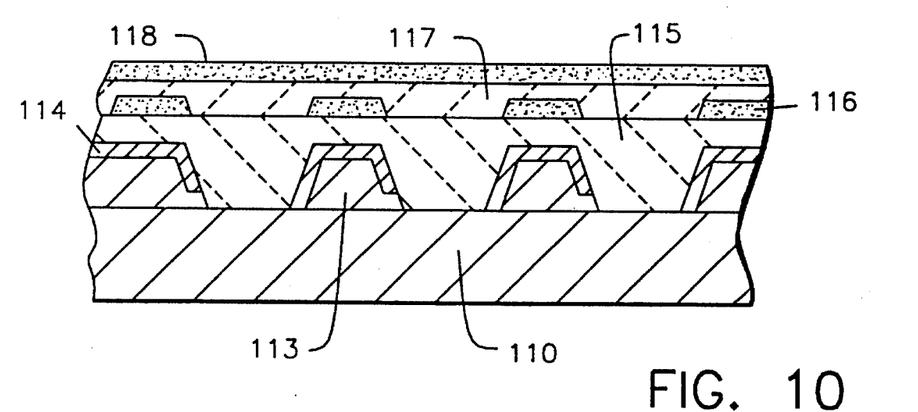
FIG. 10 shows a view for explaining other steps in the method for manufacturing the solid state image sensor of the first embodiment according to the present invention.

Then, as shown in FIG. 9, a smoothing transparent film 117 is formed throughout the whole surface by using acrylic resin or the like. Then, the material used to form the first light-shielding layer 116 is rotatively applied, as shown in FIG. 10.

Figure 11:
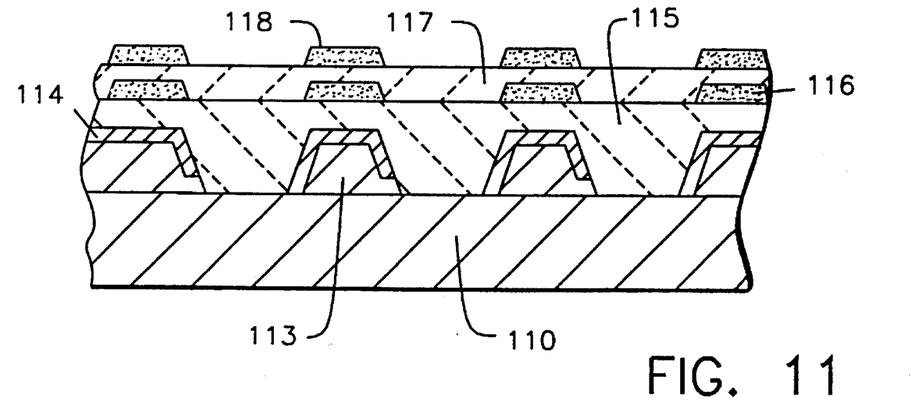
FIG. 11 shows a view for explaining other steps in the method for manufacturing the solid state image sensor of the first embodiment according to the present invention.

Then, as shown in FIG. 11, a second light-shielding layer 118 having a predetermined pattern is formed by the same process as that shown in FIG. 8. When the on-chip lens is supposed to be formed, the sectional area of the second light-shielding layer 118 is made smaller than that of the first light-shielding layer 116 so as not to block the light focused on the photodiode 111 by the on-chip lens. Incidentally, without the on-chip lens, the first light-shielding layer 116 and the second light-shielding layer 118 may have the same sectional area.

Figure 12:
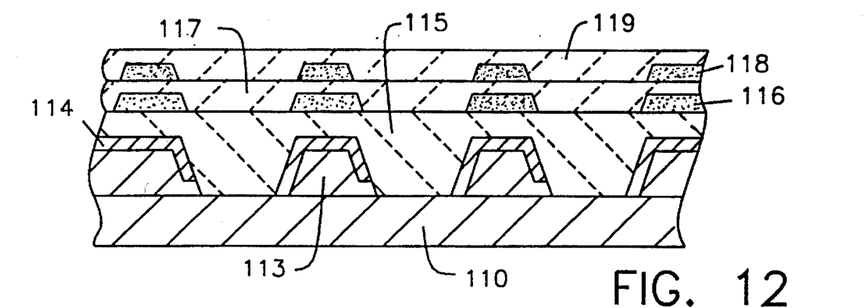
FIG. 12 shows a view for explaining other steps in the method for manufacturing the solid state image sensor of the first embodiment according to the present invention.
Figure 13:
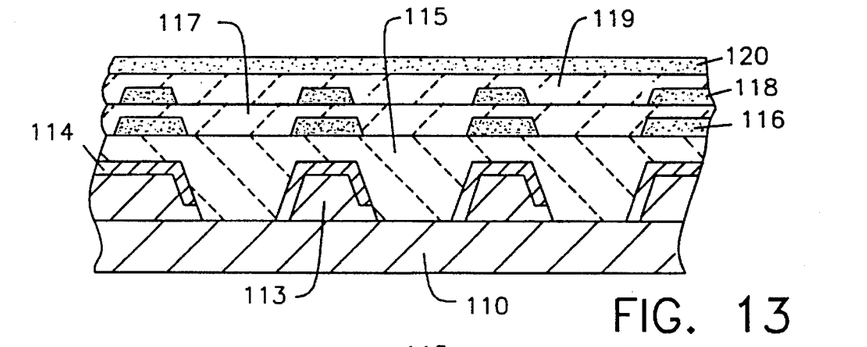
FIG. 13 shows a view for explaining other steps in the method for manufacturing the solid state image sensor of the first embodiment according to the present invention.

Next, as shown in FIG. 12, a transparent film 119 is applied throughout the whole surface. Then, as shown in FIG. 13, the material used for the first light-shielding layer 116 is rotatively applied on the transparent film 119 by the same process as that shown in FIG. 10.

Figure 14:
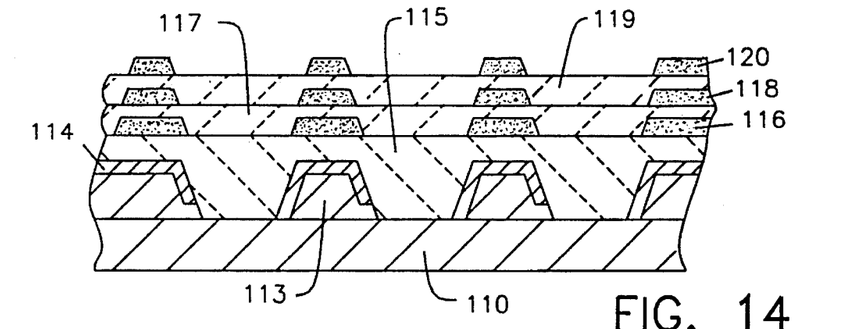
FIG. 14 shows a view for explaining other steps in the method for manufacturing the solid state image sensor of the first embodiment according to the present invention.
Figure 15:
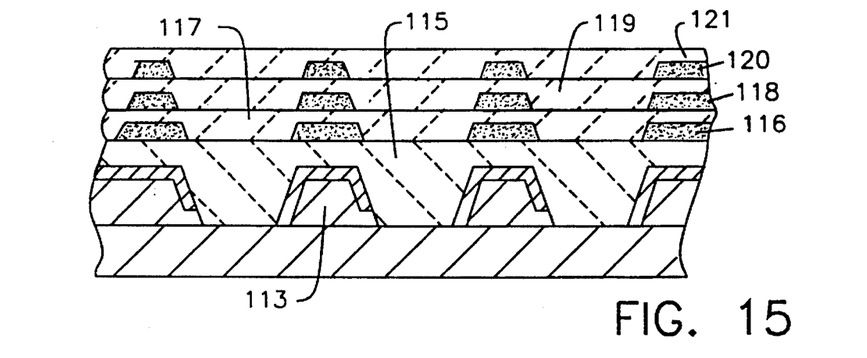
FIG. 15 shows a view for explaining other steps in the method for manufacturing the solid state image sensor of the first embodiment according to the present invention.
Figure 16:
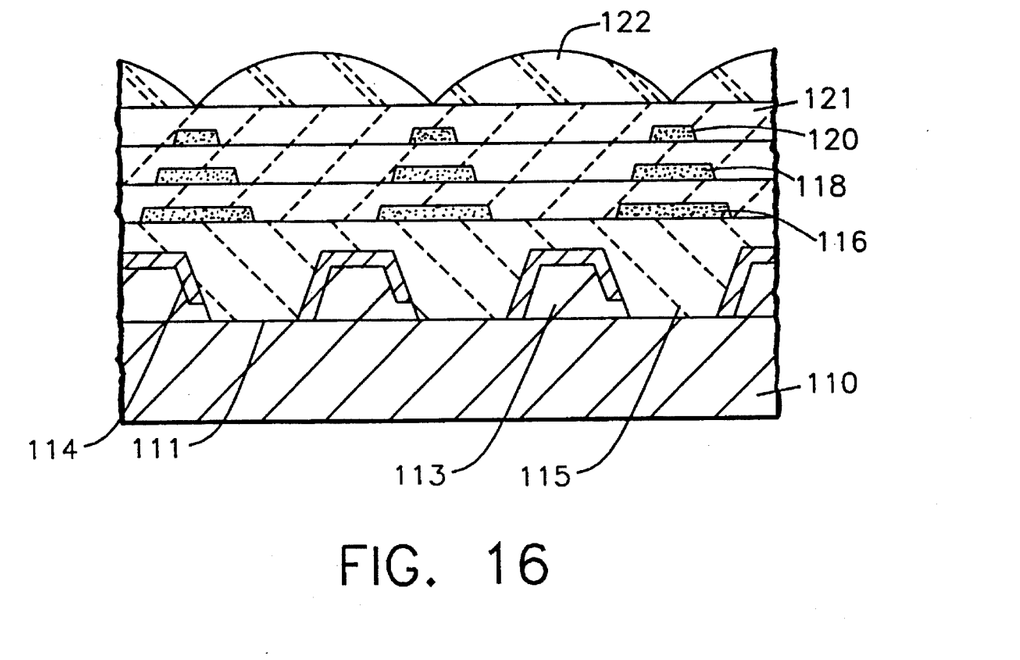
FIG. 16 shows a sectional view for explaining an on-chip lens forming step.

As shown in FIG. 14, a third light-shielding layer 120 having a predetermined pattern is formed by the same process as that shown in FIG. 11. Finally, a transparent film 121 is applied throughout the whole surface. The transparent films 117, 119, 121 applied in the above processes are optically united with each other. Incidentally, if the on-chip lens is not used, the procedure ends at the process shown in FIG. 15 or subsequently requires a color filter bonding process. If the on-chip lens is used, it is formed, after the process shown in FIG. 15, just above the photodiode 111, as shown in FIG. 16.

Next follows, with reference to the drawings, a description of the manufacturing method in a case where transparent films are not inserted into the first, second and third light-shielding layers.

Figure 17:
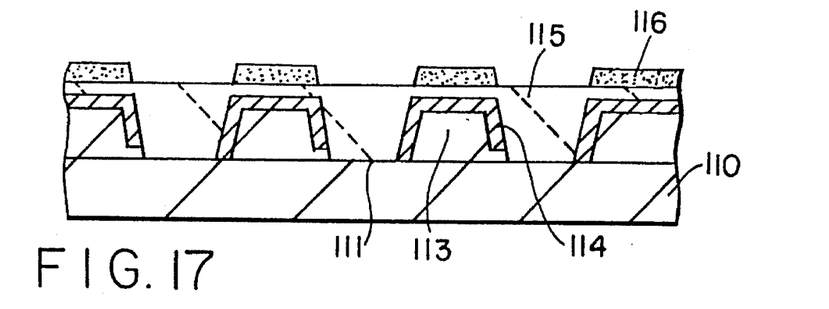
FIG. 17 shows a view for explaining steps in a method for manufacturing a solid state image sensor of a second embodiment according to the present invention.
Figure 18:
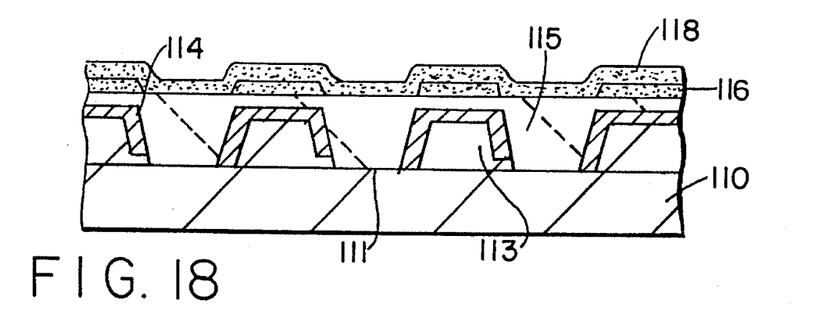
FIG. 18 shows a view for explaining other steps in the method for manufacturing the solid state image sensor of the second embodiment according to the present invention.
Figure 19:
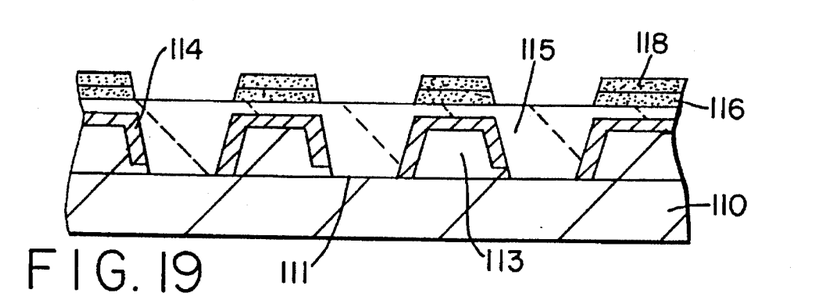
FIG. 19 shows a view for explaining other steps in the method for manufacturing the solid state image sensor of the second embodiment according to the present invention.
Figure 20:
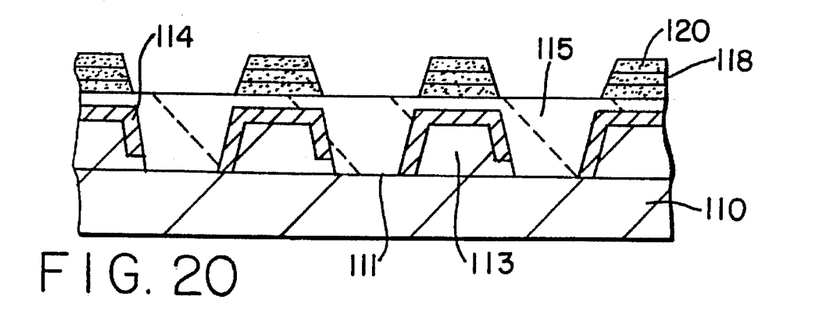
FIG. 20 shows a view for explaining other steps in the method for manufacturing the solid state image sensor of the second embodiment according to the present invention.
Figure 21:
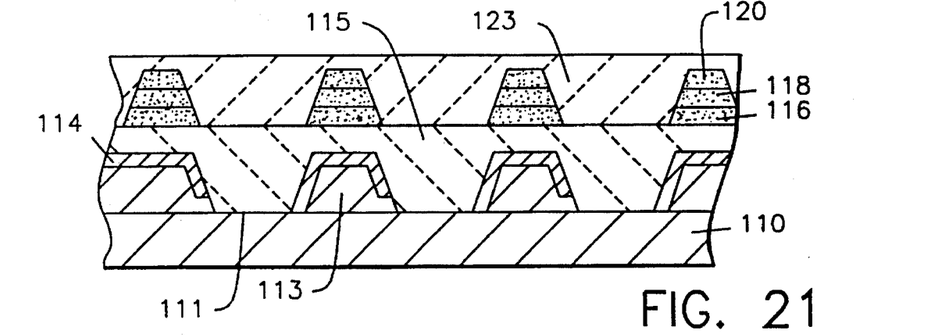
FIG. 21 shows a view for explaining other steps in the method for manufacturing the solid state image sensor of the second embodiment according to the present invention.
Figure 22:
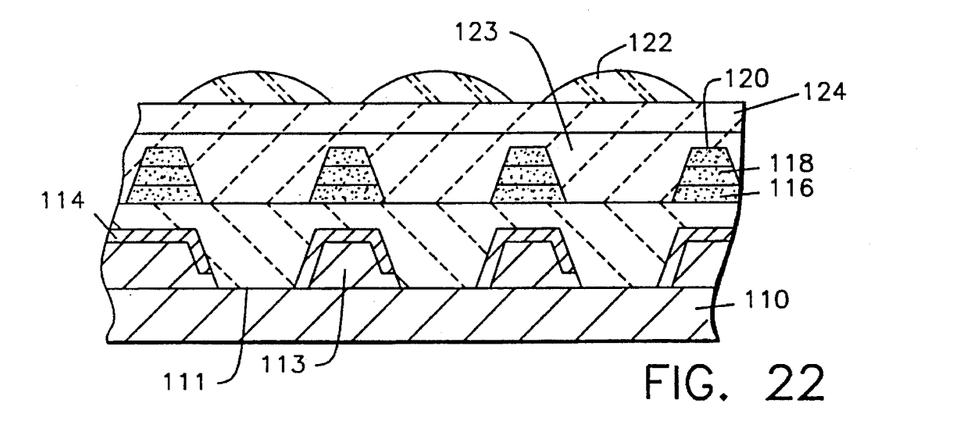
FIG. 22 shows a view for explaining other steps in the method for manufacturing the solid state image sensor of the second embodiment according to the present invention.

FIGS. 17 through 22 respectively show sectional views for explaining processes of the manufacturing method. Hereupon, those processes coming to the construction shown in FIG. 17 are the same processes as those shown in FIGS. 5 to 8, and a description thereof will be omitted. As shown in FIG. 18, the second light-shielding layer 118 employs the same material as that shown in FIG. 7; the material is rotatively applied. Then as shown in FIG. 19, the second light-shielding layer 118 is formed by means of a process similar to that shown in FIG. 8. The sectional area of the second light-shielding layer 118 is made smaller than that of the first light-shielding layer 116, as not to block light focused on the photodiode 111 by the on-chip lens. Similarly, the third light-shielding layer 120, having the sectional area smaller than the second light-shielding layer 116, is formed, as shown in FIG. 20. Next, as shown in FIG. 21, the surface is smoothed by a transparent film 123. Then, as shown in FIG. 22, after a transparent film 124 is formed by the rotation application method, the on-chip lens 122 is formed in accordance with the photodiode 111.

As mentioned above, the present invention forms two or more light-shielding layers outside the photodiode of the solid state image sensor formed on the semiconductor substrate, while inserting or not inserting transparent films between the layers; thus, among the incident light., the flare light generated from light obliquely entering the solid state image sensor or internal reflection light induced by the light-shielding metal layer can be efficiently shielded and absorbed. In addition, since the film thickness per light-shielding layer can be made small, there is no blot after development; thus, an excellent solid state image sensor for forming a better image screen can be provided. Moreover, by reducing the sectional areas of the light-shielding layers in a descending order from the semiconductor substrate, even if the on-chip micro lens is formed, a solid state image sensor can be provided which does not interrupt light focused on the photosensitive portion by the on-chip lens.

Further, the present invention is effectively applicable to any solid state image sensor employing the on-chip filter method for directly forming a color filter on the solid state image sensor substrate, a filter bonding method for bonding a color filter preformed on a plate glass, or a method which does not load a filter.

Therefore, the spirit and scope of the appended claims should not be limited to the description of the preferred versions contained herein.

What is claimed is:

1. A solid state image sensor comprising:
a light-shielding layer formed outside a photodiode of a solid state image sensing device on a semiconductor substrate which carries said solid state image sensing device;
a smooth layer formed on said light-shielding layer; and
two or more light-shielding layers formed on said smooth layer to lie, with one above the other, along an optical path for incoming light on the photodiode but lie outside the optical path.

2. A solid state image sensor according to claim 1, wherein a transparent film is formed between said light-shielding layers along the optical path of the incoming light.

3. A solid state image sensor according to claim 1, wherein at least one transparent film is formed on said two or more light-shielding layers stacked along the optical path of the incoming light.

4. A solid state image sensor according to claim 1, wherein the sectional widths of the said light-shielding layers are made sequentially narrower as being off from the semiconductor substrate along the optical path of the incoming light.

5. A solid state image sensor according to claim 3, wherein a micro lens is formed on an uppermost transparent film in accordance with a position of said photodiode of said solid state image sensing device.

6. A solid state image sensor according to claim 5, wherein a width W of each of said light-shielding layers is defined as follows:

$$W=[d(R-r)+L(P-R)]/L$$

wherein r is a width of the photodiode, r is a width of said micro lens, L is a distance from an upper surface of said photodiode to a bottom surface of said micro lens, d is a height from said photodiode to each of said light-shielding layers, and P is a distance between center points of two adjacent photodiodes.

7. A solid state image sensor according to claim 1, wherein at least one of said light-shielding layer employs a negative type of photosensitive and stainable acrylic resin.

8. A solid state image sensor according to claim 7, wherein at least one of said light-shielding layers has a film thickness of 0.3 to 0.8 μm.

9. A solid state image sensor according to claim 7, wherein each of said light-shielding layers is made of diazo-compound and dimethyl amino ethyl methacrylate (DMAEMA) which are added to acrylic copolymer.

10. A method for manufacturing a solid state image sensor comprising the steps of:
forming a photodiode and a vertical CCD in a matrix form on a semiconductor substrate;
forming a transfer gate electrode on the vertical CCD on the semiconductor substrate via an insulating film;
forming a light-shielding film on the transfer gate electrode;
forming an underlying smooth layer for smoothing the semiconductor substrate surface;
forming a first light-shielding layer on the underlying smooth layer on the transfer gate electrode;
forming a first transparent film on the first light-shielding layer and smoothing the first transparent film;
forming a second light-shielding layer on the first transparent film; and
forming a second transparent film on the second light-shielding layer and smoothing the second transparent film.

11. A method for manufacturing a solid state image sensor comprising the steps of:
forming a photodiode and a vertical CCD in a matrix form on a semiconductor substrate;
forming a transfer gate electrode on the vertical CCD on the semiconductor substrate via an insulating film;
forming a light-shielding film on the transfer gate electrode;
forming an underlying smooth layer for smoothing the semiconductor substrate surface;
forming a first light-shielding layer on the underlying smooth layer on the transfer gate electrode;

forming a first transparent film on the first light-shielding layer and smoothing the first transparent film;

forming a second light-shielding layer on the first transparent film;

forming a second transparent film on the second light-shielding layer and smoothing the second transparent film;

forming a third light-shielding layer on the second transparent film;

forming a third transparent film on the third light-shielding layer and smoothing the third transparent film; and forming a micro lens on the third transparent film.

12. An on-chip filter type solid state image sensor comprising:

a semiconductor substrate;

a photodiode disposed on the semiconductor substrate for photoelectric conversion into electric charges by incoming light;

a transfer electrode disposed on the semiconductor substrate for transmission of the electric charges from the photodiode;

a light-shielding layer disposed to cover the transfer electrode and shield the transfer electrode against the incoming light;

a smooth layer disposed on the light-shielding layer;

a micro lens disposed above the smooth layer for collecting the incoming light; and two or more light-shielding layers disposed between the smooth layer and the micro lens and arranged along an optical path of the incoming light traveling from the micro lens to the photodiode and located outside the optical path of the incoming light on the photodiode, for shielding the incoming light reflected from the transfer electrode.

13. A solid state image sensor comprising:

a semiconductor substrate;

a photodiode disposed on the semiconductor substrate for photoelectric conversion into electric charges by incoming light;

a light-shielding layer formed and arranged along an optical path of the incoming light on the photodiode and outside the optical path of the incoming light on the photodiode, said light-shielding layer comprising diazo-compound and dimethyl amino ethyl methacrylate (DMAEMA) which are added to acrylic copolymer.

* * * * *